(12) United States Patent
Calanca (10) Patent No.: US 9,787,256 B1
(45) Date of Patent: Oct. 10, 2017

(54) COUPLED COILS INTER-STAGE MATCHING NETWORK

(71) Applicant: Peregrine Semiconductor Corporation, San Diego, CA (US)

(72) Inventor: Neil Calanca, Coral Springs, FL (US)

(73) Assignee: Peregrine Semiconductor Corporation, San Diego, CA (US)

( * ) Notice: Subject to any disclaimer, the term of this patent is extended or adjusted under 35 U.S.C. 154(b) by 0 days.

(21) Appl. No.: 15/184,738

(22) Filed: Jun. 16, 2016

(51) Int. Cl.
*H03F 3/195* (2006.01)
*H03F 3/213* (2006.01)
*H03F 1/56* (2006.01)

(52) U.S. Cl.
CPC ............ *H03F 1/565* (2013.01); *H03F 3/195* (2013.01); *H03F 3/213* (2013.01); *H03F 2200/222* (2013.01); *H03F 2200/451* (2013.01)

(58) Field of Classification Search
USPC ........................................ 330/301–307, 188
See application file for complete search history.

(56) References Cited

U.S. PATENT DOCUMENTS

| | | | |
|---|---|---|---|
| 7,088,971 B2 | 8/2006 | Burgener et al. | |
| 7,248,120 B2 | 7/2007 | Burgener et al. | |
| 7,910,993 B2 | 3/2011 | Brindle et al. | |
| 7,936,245 B2 | 5/2011 | Huang et al. | |
| 8,446,217 B2 * | 5/2013 | Bagga ..................... | H03F 1/342 330/104 |
| 8,649,754 B2 | 2/2014 | Burgener et al. | |
| 8,742,502 B2 | 6/2014 | Brindle et al. | |
| 9,024,700 B2 | 5/2015 | Ranta | |

OTHER PUBLICATIONS

Zolfaghari, et al., "Stacked Inductors and Transformers in CMOS Technology", IEEE Journal of Solid-State Circuits, vol. 36, No. 4, Apr. 2001, pp. 620-628.

* cited by examiner

*Primary Examiner* — Hieu Nguyen
(74) *Attorney, Agent, or Firm* — Jaquez Land Greenhaus LLP; Martin J. Jaquez, Esq.; John Land, Esq.

(57) ABSTRACT

An amplifier circuit having an improved inter-stage matching network and improved performance. In one embodiment, an RF signal source having an output impedance $Z_{SOURCE}$ is approximately impedance matched through an inductive tuning circuit to a power amplifier having an input impedance $Z_{PA}$. The inductive tuning circuit includes a tunable capacitor element C1 and inductive elements L1, L2, which may be fabricated as stacked conductor coils. Since the capacitance of C1 is tunable, impedance matching is available over a broad range of RF frequencies. Also provided are DC isolation between the RF signal source and the power amplifier, coupling of a voltage source to the output of the RF signal source through L1, and coupling of a bias voltage to the input of the power amplifier through L2.

23 Claims, 5 Drawing Sheets

COUPLED COILS INTER-STAGE MATCHING NETWORK

BACKGROUND

(1) Technical Field

This invention generally relates to electronic circuitry, and more specifically to matching networks for power amplifiers in radio frequency based integrated circuits.

(2) Background

A typical requirement of a radio frequency (RF) circuit is that signal inputs and outputs of various coupled components be matched to a characteristic impedance, typically 50 ohms in modern RF systems. For example, in an RF amplifier, a driver circuit stage may be coupled to a power amplifier stage. Ideally, the input of the power amplifier stage should be impedance matched to the output of the driver circuit stage to allow the driver circuit stage to operate with optimal efficiency and gain.

Figure 1:
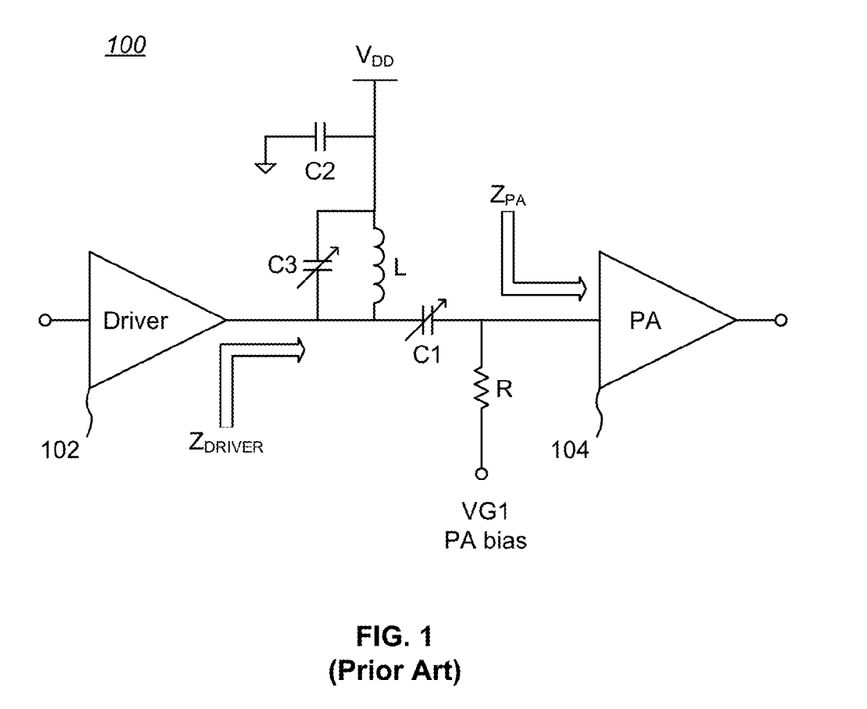
FIG. 1 is a schematic of a typical prior art amplifier circuit including a driver capacitively coupled to a power amplifier.

As one example, FIG. 1 is a schematic of a typical prior art amplifier circuit 100 including a driver 102 capacitively coupled to a power amplifier 104. A blocking capacitor C1 provides DC isolation from the output of the driver 102 to the input of the power amplifier 104, necessary because the output of the driver 102 is biased from a DC voltage supply, $V_{DD}$, while the input to the power amplifier 104 is biased from a different voltage source, VG1 (generated elsewhere) through a bias resistor R.

A fixed capacitance for the blocking capacitor C1 would result in narrowband operational characteristics; accordingly, in some embodiments, the blocking capacitor C1 is a variable capacitor or selectable capacitance (as indicated by the arrow symbol through C1) to increase the useful frequency range of operation for the amplifier circuit 100.

An optional bypass capacitor C2 (also known as a decoupling capacitor) is coupled between $V_{DD}$, and circuit ground to stabilize the voltage and current from $V_{DD}$. As is known in the art, a bypass capacitor is used to decouple one part of an electrical circuit from another part to mitigate transient events such as superimposed AC signals or voltage spikes, and to provide local energy storage to mitigate current demand due to voltage changes. However, if the voltage source is very well regulated, the bypass capacitor may not be needed in some applications.

A tunable capacitor C3 is coupled in parallel with an inductor L, and C3 and L are coupled in series with $V_{DD}$ and to the signal path between the output of the driver 102 and the blocking capacitor C1. Together with the blocking capacitor C1, the tunable capacitor C3 and the inductor L form an L-type asymmetrical matching network that provides for basic impedance matching between the output impedance $Z_{DRIVER}$ of the driver 102 and the input impedance $Z_{PA}$ of the power amplifier 104.

One drawback of the prior art amplifier circuit 100 is the presence of the bias resistor R, which can limit the analog baseband bandwidth of the circuit, resulting in an adverse performance for wideband signals. In particular, the Error Vector Magnitude (EVM), which is a measure used to quantify the performance of a digital radio transmitter or receiver, and the Adjacent Channel Power Ratio (ACPR), which is the ratio between the total power of an adjacent channel (intermodulation signal) to the power of the main channel (useful signal), are negatively impacted.

Another disadvantage of the prior art amplifier circuit 100 is a limited range of impedance transformation. Due to the L-type matching network topology and the number of required circuit elements, this circuit topology can miss large areas of a Smith chart which might be more desirable for matching $Z_{PA}$ to $Z_{DRIVER}$. Further, due to the two-element (LC equivalent circuit) L-type matching network, multiple tunable elements (i.e., C1, C3) are required, and the bandwidth of the amplifier circuit 100 is relatively narrow even with a tunable blocking capacitor C1.

Accordingly, there is a need for an amplifier circuit having an improved inter-stage matching network and improved performance. The present invention addresses this need.

SUMMARY OF THE INVENTION

The present invention includes an amplifier circuit having an improved inter-stage matching network and improved performance. In one embodiment, an amplifier circuit including a RF signal source is coupled through an inductive tuning circuit to a power amplifier. The RF signal source may be, for example, a driver circuit, and has an output impedance $Z_{SOURCE}$. The power amplifier has an input impedance $Z_{PA}$ which generally will be different from $Z_{SOURCE}$. The inductive tuning circuit provides impedance matching for the amplifier circuit. Included within the inductive tuning circuit is a tunable capacitor element C1 having two or more capacitance values that may be selected by suitable control circuitry. Also included within the inductive tuning circuit is an isolation element comprising inductive elements L1, L2 having a coupling coefficient of k. The isolation element provides DC blocking between the RF signal source and the power amplifier. In a preferred embodiment, the inductive elements L1, L2 are fabricated on an integrated circuit (IC) as stacked inductive coils.

In operation, an output signal from the RF signal source is approximately impedance matched by and coupled through the inductive tuning circuit to the input of the power amplifier. Since the capacitance of C1 is tunable, approximate impedance matching is available over a broad range of RF frequencies. The amplifier circuit topology is inherently bandpass in nature, which helps combat low-frequency gain peaking (i.e., peaks in gain caused by frequency-dependent parasitic elements) and concomitant stability issues common in conventional power amplifier designs.

The inductive tuning circuit provides for necessary DC isolation between the RF signal source and the power amplifier, coupling of a voltage source $V_{DD}$ to the output of the RF signal source through one of the inductive elements, L1, and coupling of a bias voltage VG1 to the input of the power amplifier through the other inductive element, L2, thus avoiding adding in an explicit resistor component.

The details of one or more embodiments of the invention are set forth in the accompanying drawings and the description below. Other features, objects, and advantages of the invention will be apparent from the description and drawings, and from the claims.

DESCRIPTION OF THE DRAWINGS

Like reference numbers and designations in the various drawings indicate like elements.

DETAILED DESCRIPTION OF THE INVENTION

The present invention includes an amplifier circuit having an improved inter-stage matching network and improved performance.

Figure 2:
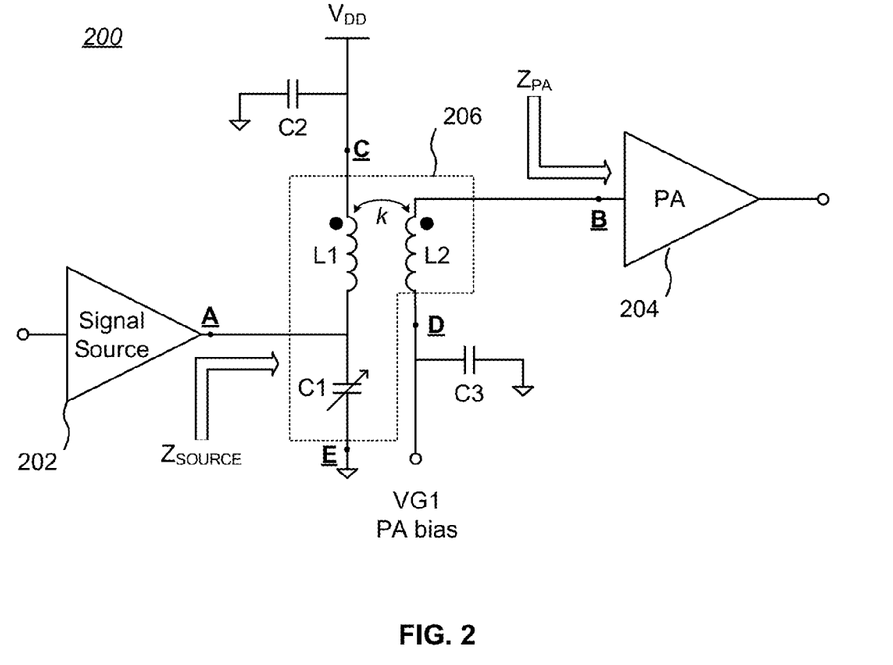
FIG. 2 is a schematic of one embodiment of an amplifier circuit including a driver coupled through an inductive tuning circuit to a power amplifier in accordance with the present invention.

FIG. 2 is a schematic of one embodiment of an amplifier circuit 200 including a RF signal source 202 coupled through an inductive tuning circuit to a power amplifier 204 in accordance with the present invention. The RF signal source 202 may be, for example, a driver circuit, and has an output impedance $Z_{SOURCE}$. The power amplifier 204 has an input impedance $Z_{PA}$ which generally will be different from $Z_{SOURCE}$ (hence the need for impedance matching). An inductive tuning circuit 206 bounds the principal impedance matching components of the amplifier circuit 200.

Included within the inductive tuning circuit 206 is a tunable capacitor element C1 having two or more capacitance values that may be selected by suitable control circuitry (not shown). The tunable capacitor element C1 is preferably a digitally tunable capacitor (DTC) of the type taught in U.S. Pat. No. 9,024,700, issued on May 5, 2015, entitled "Method and Apparatus for use in Digitally Tuning a Capacitor in an Integrated Circuit Device", which was assigned to the assignee of the present invention and is hereby incorporated by reference. However, the tunable capacitor element C1 may be alternatively implemented in a number of other ways such that one of two or more capacitance values may be selected by suitable control circuitry.

Also included within the inductive tuning circuit 206 is an isolation element comprising inductive elements L1, L2 having a coupling coefficient of k and a mutual inductance M; the dots associated with L1 and L2 indicate polarity. The coupling coefficient k is defined in EQ. 1 as follows:

$$k = \frac{M}{\sqrt{L_1 \cdot L_2}} \qquad \text{EQ. 1}$$

where $L_1$ and $L_2$ are the self-inductances of the inductive elements L1, L2, and M is the mutual or coupling inductance between the inductive elements L1, L2. The isolation element provides DC blocking between the RF signal source 202 and the power amplifier 204.

Figure 3:
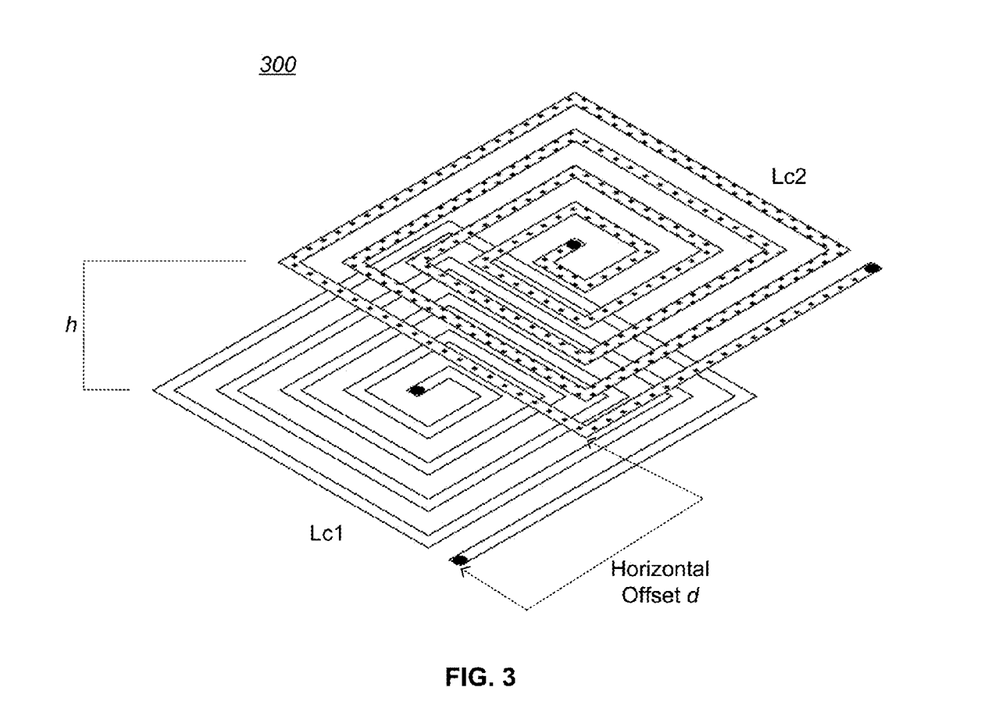
FIG. 3 is a perspective diagram of stacked inductive coils.

In a preferred embodiment, the inductive elements L1, L2 are fabricated on an integrated circuit (IC) as stacked inductive coils. For example, FIG. 3 is a perspective diagram 300 of stacked inductive coils Lc1 and Lc2, which correspond to the inductive elements L1, L2 of FIG. 2. The inductive coils Lc1, Lc2 may be formed on an IC as conductive signal paths, in known fashion. In the illustrated example, the inductive coils Lc1, Lc2 are vertically spaced by a distance h, which may be accomplished by interposing an insulating layer between the conductive signal paths during the IC fabrication process. For optimum inductive coupling, the inductive coils Lc1, Lc2 should be essentially concentric and have a small value for h, but the coils may have some horizontal offset d to accommodate fabrication constraints or to achieve a specified degree of coupling.

While the inductive coils Lc1, Lc2 are shown with straight, nearly regular sides, other configurations may be used, such as smooth spirals, polygonal spirals, irregularly coiled shapes, etc., as is known in the art. Using stacked inductive coils Lc1, Lc2 for the inductive elements L1, L2 of FIG. 2 is particularly useful in complementary metal oxide semiconductor (CMOS) ICs fabricated on high-Q substrates, such as silicon-on-insulator (SOI) substrates, which include silicon-on-sapphire (SOS) substrates. However, external (off-chip) inductive elements L1, L2 may also be used.

Referring back to FIG. 2, the tunable capacitor element C1 is series coupled as shown between circuit ground and a first terminal of L1. A second terminal of L1 is coupled to $V_{DD}$. An optional bypass capacitor C2 is coupled to the signal path between $V_{DD}$ and L1, and performs the functions noted above for capacitor C2 in FIG. 1. The output of the RF signal source 202 is coupled to the signal path between L1 and C1. As noted above, L1 and L2 have a mutual inductance. A first terminal of L2 is coupled to the input of the power amplifier 204. A second terminal of L2 is directly coupled to a bias voltage source VG1 to provide a DC bias voltage to the power amplifier 204. Notable, no separate bias resistor R is required (as in FIG. 1), since the reactance of L2 provides the necessary isolation between the power amplifier 204 bias voltage source VG1 and the input of the power amplifier 204. An optional bypass capacitor C3 is coupled to the signal path between VG1 and L2 to stabilize the voltage and current from VG1.

In operation, an output signal from the RF signal source 202 is approximately impedance matched by and coupled through the inductive tuning circuit 206 to the input of the power amplifier 204. Due to the current circuit topology, since the capacitance of C1 is tunable, closely approximate (including optimum) impedance matching is available over a broad range of RF frequencies, and specifically over a wider bandwidth than the conventional topology shown in FIG. 1. The amplifier circuit 200 topology is inherently bandpass in nature, which helps combat low-frequency gain peaking (i.e., peaks in gain caused by frequency-dependent parasitic elements) and concomitant stability issues common in conventional power amplifier designs.

Selection of a capacitance value for the tunable capacitor element C1 may be, for example, by means of control words provided from an external source through a digital interface, or control words may be indirectly supplied through combinatorial circuitry or from a look-up table (e.g., implemented as fuses, PROM, EEPROM, etc.) containing tuning states for various RF bands. Thus, program control of the tunable capacitor element C1 can be based on a user state selection or external control signals, or be automatically set in response to one or more detected system states or parameters (e.g., selected frequency band, pre-determined lookup values, detected signal frequency, signal strength, power consumption, IC device temperature, etc.), alone or in combination with a user state selection or external control signals. Mapped capacitance values may be determined for integrated circuits (ICs) that include the amplifier circuit 200 by characterizing circuit models of the IC or fabricated samples of the IC, or by calibration of individual IC units.

Figure 4:
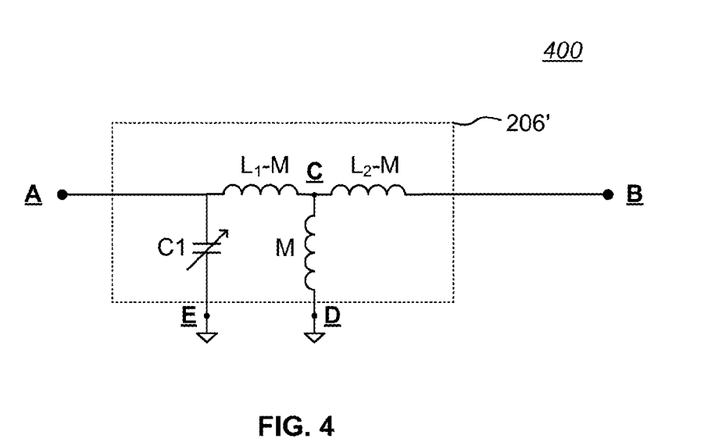
FIG. 4 is a schematic of an equivalent circuit for the principal operational elements of the inductive tuning circuit of FIG. 2.

Many of the advantages of the amplifier circuit 200 topology of the present invention may be better understood by considering an equivalent circuit for the inductive tuning circuit 206. FIG. 4 is a schematic of an equivalent circuit 400 for the principal operational elements of the inductive tuning circuit of FIG. 2. Lettered nodes A-E in FIG. 4 corresponding to like-lettered nodes A-E in FIG. 2. The inductive tuning circuit 206 of FIG. 2 can be represented as an equivalent circuit 206' comprising the tunable capacitor element C1 shunt coupled to a T-model of the inductive elements L1, L2. That is, the two inductive elements L1, L2 of FIG. 2 can be represented as three inductors in a T-configuration, as shown in FIG. 4, having inductance values of $L_1-M$, $L2-M$, and M, where $L_1$, $L_2$, and M have the meanings given with respect to Equation 1 above.

Figure 5:
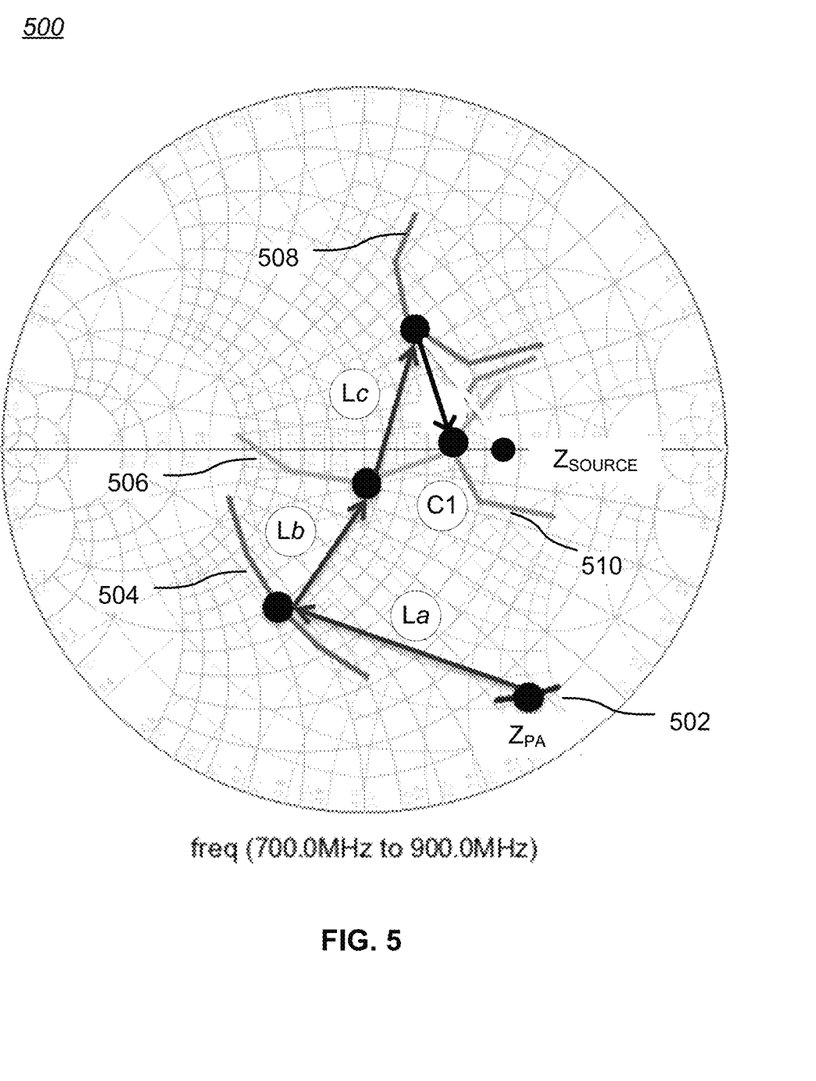
FIG. 5 is a Smith chart showing the influence of each equivalent component of FIG. 4 on $Z_{PA}$ with respect to $Z_{SOURCE}$ for one simulated circuit.

FIG. 5 is a Smith chart showing the influence of each equivalent component of FIG. 4 on $Z_{PA}$ with respect to $Z_{SOURCE}$ for one simulated circuit. In FIG. 5, the mappings in TABLE 1 are used:

TABLE 1

| Smith Chart Symbol | Equivalent component in FIG. 4 |
| --- | --- |
| $L_a$ | L2-M |
| $L_b$ | $L_1$-M |
| $L_c$ | M |

The Smith chart is normalized to the geometric mean of real($Z_{PA}$) and real($Z_{SOURCE}$) and includes data plots over a frequency range of 700 MHz to 900 MHz. Five curves are plotted that show the influence of each equivalent component of FIG. 4 on $Z_{PA}$ with respect to $Z_{SOURCE}$ over the selected frequency range; the dots on each curve represents the midpoint of the frequency range.

Accordingly, curve 502 represents the impedance mismatch between $Z_{PA}$ and $Z_{SOURCE}$ with no impedance matching. Adding La changes the mismatch to curve 504; adding Lb changes the mismatch to curve 506; adding Lc changes the mismatch to curve 508. Finally, adding C1 changes the mismatch to curve 510, which closely circles around the impedance $Z_{SOURCE}$ of the RF signal source 202 as frequency varies.

Advantages

The amplifier circuit 200 topology provides a number of advantages in addition to the benefits noted in the detailed description above. With respect to impedance transformation, the tunable embodiments of the amplifier circuit 200 topology cover a larger area of the Smith chart than conventional capacitively-coupled circuits, which provides for a broader range of impedance matching for $Z_{SOURCE}$. The amplifier circuit 200 topology is essentially a 4-element T-type matching network (i.e., La, Lb, Lc, and C1), which is inherently more broadband than the two-element (LC equivalent circuit) L-type matching network of a conventional amplifier circuit 100 of the type shown in FIG. 1. Further, the inductive amplifier circuit 200 topology exhibits less insertion loss over a broader frequency range than the capacitively coupled amplifier circuit 100 of FIG. 1.

With respect to IC fabrication, the design choices for L1, L2, C1, and k are amenable to integration given the typical constraints of an IC amplifier design. Further, there is only one tunable element (C1) in the circuit, thus saving IC die area and reducing the complexity of the associated tuning circuitry as compared to a conventional amplifier circuit 100 of the type shown in FIG. 1.

While providing for improved inter-stage matching network and improved performance, the amplifier circuit 200 topology also provides for necessary DC isolation between the RF signal source 202 and the power amplifier 204, since the inductive elements L1, L2 are inherently isolated from one another at DC.

The amplifier circuit 200 topology also provides for coupling $V_{DD}$ to the output of the RF signal source 202 through one of the inductive elements, L1, while utilizing the inductor feed as one of the impedance matching elements, which is inherently more broadband at baseband frequencies and more desirable for power amplifier systems with wide modulation bandwidths, such as are typically seen in high data rate RF telecommunication standards. This configuration provides a dual use for inductor L1 as both a bias choke and an element of an inter-stage matching network.

The amplifier circuit 200 topology further provides for a bias voltage VG1 to the input of the power amplifier 204 that avoids adding in an explicit resistor component, instead utilizing the reactance of the other inductive element, L2. Accordingly, this amplifier circuit 200 topology generally exhibits good Adjacent Channel Power Ratio (ACPR) and Error Vector Magnitude (EVM) performance for wideband signals. In addition, the inductive elements L1, L2 provide good RF filtering so as not to perturb the analog circuitry (not shown) that provides the VG1 bias voltage (i.e., the RF-DC isolation works in both directions).

Methods

Figure 6:
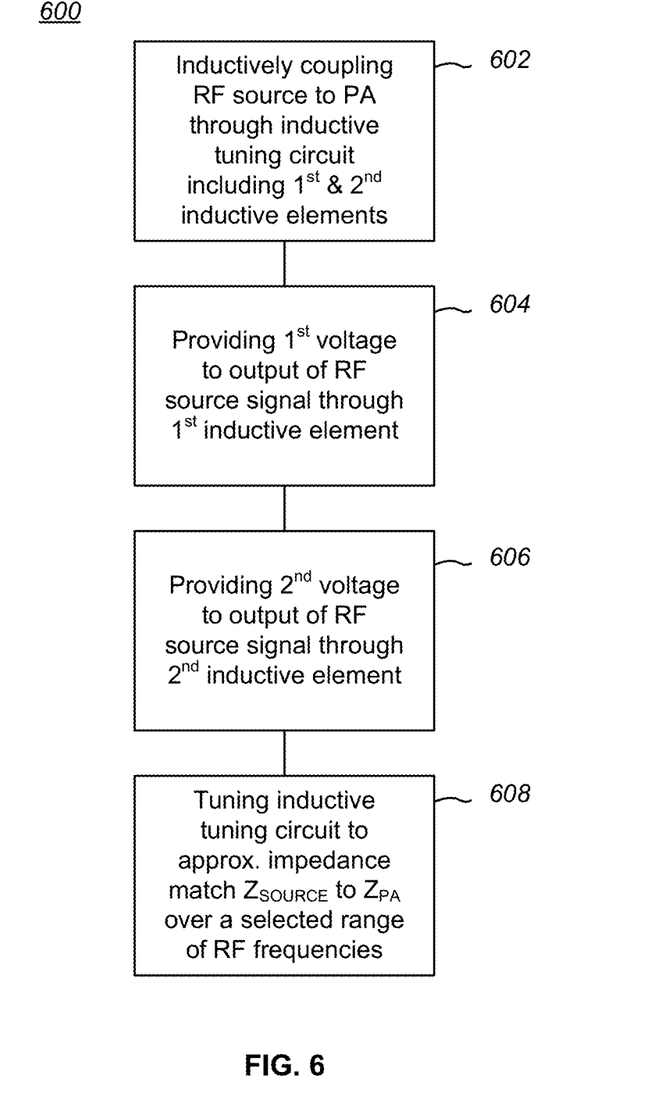
FIG. 6 is a flow-chart of one embodiment of a method of impedance matching an RF source signal having an output with impedance $Z_{SOURCE}$ to a power amplifier input having an input with impedance $Z_{PA}$.

FIG. 6 is a flow-chart of one embodiment of a method 600 of impedance matching an RF source signal having an output with impedance $Z_{SOURCE}$ to a power amplifier input having an input with impedance $Z_{PA}$. The method includes inductively coupling the output of the RF source signal to the input of the power amplifier PA through an inductive tuning circuit including first and second inductive elements having a mutual inductance M, and a tunable capacitor element coupled to the first inductive element and configured to be coupled to circuit ground (STEP 602); providing a first voltage to the output of the RF source signal through the first inductive element (STEP 604); providing a second voltage to the input of the power amplifier through the second inductive element (STEP 606); and tuning the inductive tuning circuit to approximately impedance match $Z_{SOURCE}$ to $Z_{PA}$ over a selected range of RF frequencies (STEP 608). As should be clear, some of the above steps may be performed in a different order while achieving the same outcome.

Another aspect of the invention includes a method of impedance matching a radio frequency (RF) source signal to a power amplifier input in an amplifier circuit, including providing a power amplifier having an input with impedance $Z_{PA}$; providing an inductive tuning circuit including first and second inductive elements having a mutual inductance M, and each having a first terminal and a second terminal, and a tunable capacitor element coupled to the first terminal of the first inductive element and configured to be coupled to circuit ground, wherein: a node between the first terminal of the first inductive element and the tunable capacitor element is configured to be coupled to an RF signal source having an output with impedance $Z_{SOURCE}$; the second terminal of the first inductive element is configured to be coupled to a first voltage source; the first terminal of the second inductive element is coupled to the input of the power amplifier; and the second terminal of the second inductive element is configured to be coupled to a second voltage source; and tuning the inductive tuning circuit to approximately impedance match $Z_{SOURCE}$ to $Z_{PA}$ over a selected range of RF frequencies.

Still another aspect of the invention includes a method of impedance matching a radio frequency (RF) source signal to a power amplifier input in an amplifier circuit, including providing an inductive tuning circuit including first and second inductive element having a mutual inductance M, and each having a first terminal and a second terminal, and a tunable capacitor element coupled to the first terminal of the first inductive element and configured to be coupled to circuit ground; providing an RF signal source having an output with impedance $Z_{SOURCE}$, the output being coupled between the first terminal of the first inductive element and the tunable capacitor element; providing a power amplifier having an input with impedance $Z_{PA}$, the input being coupled to the first terminal of the second inductive element; providing a first voltage source coupled to the second terminal of the first inductive element; providing a second voltage source coupled to the second terminal of the second inductive element; and tuning the inductive tuning circuit is approximately impedance match $Z_{SOURCE}$ to $Z_{PA}$ over a selected range of RF frequencies.

Another aspect of the invention includes a method of impedance matching a radio frequency (RF) source signal to a power amplifier input in an amplifier circuit, including providing an inductive tuning circuit including first and second inductive stacked inductive coils having a mutual inductance M, and each having a first terminal and a second terminal, and a digitally tunable capacitor element coupled to the first terminal of the first inductive element and configured to be coupled to circuit ground; providing a driver circuit having an output with impedance $Z_{SOURCE}$, the output being coupled between the first terminal of the first inductive element and the tunable capacitor element; providing a power amplifier having an input with impedance $Z_{PA}$, the input being coupled to the first terminal of the second inductive element; providing a first voltage source coupled to the second terminal of the first inductive element; providing a second voltage source coupled to the second terminal of the second inductive element; and tuning the inductive tuning circuit is approximately impedance match $Z_{SOURCE}$ to $Z_{PA}$ over a selected range of RF frequencies.

Other aspects of the above methods include fabricating the first and second inductive elements on an integrated circuit as stacked inductive coils; wherein the RF signal source is a driver circuit; wherein the tunable capacitor element is a digitally tunable capacitor; providing a first bypass capacitor coupled to the second terminal of the first inductive element; providing a second bypass capacitor coupled to the second terminal of the second inductive element; fabricating the RF amplifier circuit as an integrated circuit; fabricating the integrated circuit on a high Q substrate; and fabricating the integrated circuit on a silicon-on-insulator (SOI) substrate using complementary metal oxide semiconductor (CMOS) technology.

Uses

Amplifier circuits having an improved inter-stage matching network and improved performance in accordance with the present invention are useful in a wide variety of circuits for performing a range of functions, including (but not limited to) RF power amplifiers and low-noise amplifiers (LNAs), and can operate over a wide frequency range (e.g., hundreds of MHz centered in MHz and GHz RF bands). Such functions are particularly useful in such applications as test equipment, radar systems (including phased array and automotive radar systems), and radio systems. Radio system usage includes (again, without limitation) cellular radio systems (including base stations, relay stations, and hand-held transceivers) that use technologies such as orthogonal frequency-division multiplexing ("ODFM") and variants thereof, high quadrature amplitude modulation ("QAM"), Code Division Multiple Access ("CDMA"), Wide Band Code Division Multiple Access ("W-CDMA"), Worldwide Interoperability for Microwave Access ("WIMAX"), Global System for Mobile Communications ("GSM"), Enhanced Data Rates for GSM Evolution (EDGE), Long Term Evolution ("LTE"), as well as other radio communication standards and protocols.

Fabrication Technologies and Options

As should be readily apparent to one of ordinary skill in the art, various embodiments of the invention can be implemented to meet a wide variety of specifications. Unless otherwise noted above, selection of suitable component values is a matter of design choice and various embodiments of the invention may be implemented in any suitable IC technology (including but not limited to MOSFET and IGFET structures), or in hybrid or discrete circuit forms. Integrated circuit embodiments may be fabricated using any suitable substrates and processes, including but not limited to silicon-on-insulator (SOI), silicon-on-sapphire (SOS), standard bulk silicon, GaN HEMT, GaAs pHEMT, and MESFET technologies. However, the inventive concepts described above are particularly useful with an SOI-based fabrication process (including SOS), and with fabrication processes having similar characteristics, especially a high resistivity substrate that can support high-Q inductors (define as a "high-Q substrate" for purposes of this disclosure). Fabrication in CMOS on SOI or SOS enables low power consumption, high-Q inductive elements, the ability to withstand high power signals during operation (e.g., using FET stacking), good linearity, and high frequency operation (in excess of about 10 GHz, and particularly above about 20 GHz). Monolithic IC implementation is particularly useful since parasitic capacitances generally can be kept low (or at a minimum, kept uniform across all units, permitting them to be compensated) by careful design. Additional circuit components may be added to enhance the capabilities of the disclosed circuits and/or to provide additional functional without significantly altering the functionality of the disclosed circuits.

In order to improve linearity and other performance characteristics, particularly when using an SOI-based fabrication process (including SOS), it may be especially useful to structure and fabricate FETs within a circuit utilizing the invention (e.g., in FIG. 2, within the signal source 202, power amplifier 204, and a DTC implementation of C1) in accordance with the teachings of U.S. Pat. No. 7,910,993, issued Mar. 22, 2011, entitled "Method and Apparatus for use in Improving Linearity of MOSFETs Using an Accumulated Charge Sink"; and U.S. Pat. No. 8,742,502, issued Jun. 3, 2014, entitled "Method and Apparatus for use in Improving Linearity of MOSFETs Using an Accumulated Charge Sink", and assigned to the assignee of the present invention, both of which are hereby incorporated by reference The term "MOSFET" technically refers to metal-oxide-semiconductors; another synonym for MOSFET is "MISFET", for metal-insulator-semiconductor FET. However, "MOSFET" has become a common label for most types of insulated-gate FETs ("IGFETs"). Despite that, it is well known that the term "metal" in the names MOSFET and MISFET is now often a misnomer because the previously metal gate material is now often a layer of polysilicon (polycrystalline silicon). Similarly, the "oxide" in the name MOSFET can be a misnomer, as different dielectric materials are used with the aim of obtaining strong channels with smaller applied voltages. Accordingly, the term "MOSFET" as used herein is not to be read as literally limited to metal-oxide-semiconductors, but instead includes IGFETs in general.

Voltage levels may be adjusted or voltage and/or logic signal polarities reversed depending on a particular specification and/or implementing technology (e.g., NMOS, PMOS, or CMOS, and enhancement mode or depletion mode transistor devices). Component voltage, current, and power handling capabilities may be adapted as needed, for example, by adjusting device sizes, serially "stacking" components (particularly FETs) to withstand greater voltages, and/or using multiple components in parallel to handle greater currents. Examples of FET stacking are shown in U.S. Pat. No. 7,248,120, issued Jul. 24, 2007, entitled "Stacked Transistor Method and Apparatus"; U.S. Pat. No. 7,088,971, issued Aug. 8, 2006, entitled "Integrated RF Front End"; and U.S. Pat. No. 8,649,754, issued Feb. 11, 2014, entitled "Integrated RF Front End with Stacked Transistor Switch", and assigned to the assignee of the present invention, all of which are hereby incorporated by reference.

A number of embodiments of the invention have been described. It is to be understood that various modifications may be made without departing from the spirit and scope of the invention. For example, some of the steps described above may be order independent, and thus can be performed in an order different from that described. Further, some of the steps described above may be optional. Various activities described with respect to the methods identified above can be executed in repetitive, serial, or parallel fashion. It is to be understood that the foregoing description is intended to illustrate and not to limit the scope of the invention, which is defined by the scope of the following claims, and that other embodiments are within the scope of the claims.

What is claimed is:

1. A radio frequency (RF) amplifier circuit, including:
   (a) a power amplifier having an input with impedance $Z_{PA}$;
   (b) an inductively coupled tuning circuit including first and second inductive elements having a mutual inductance and each having a first terminal and a second terminal, and a tunable capacitor element coupled to the first terminal of the first inductive element and configured to be coupled to circuit ground, wherein:
      (1) a node between the first terminal of the first inductive element and the tunable capacitor element is configured to be coupled to an RF signal source having an output with impedance $Z_{SOURCE}$;
      (2) the second terminal of the first inductive element is configured to be coupled to a first DC voltage source;
      (3) the first terminal of the second inductive element is coupled to the input of the power amplifier; and
      (4) the second terminal of the second inductive element is configured to be coupled to a second DC voltage source;
   wherein the output of the RF signal source is inductively coupled to the input of the power amplifier and the inductive tuning circuit is tunable to approximately impedance match $Z_{SOURCE}$ to $Z_{PA}$ over a selected range of RF frequencies.

2. A radio frequency (RF) amplifier circuit, including:
   (a) an inductively coupled tuning circuit including first and second inductive elements having a mutual inductance and each having a first terminal and a second terminal, and a tunable capacitor element coupled to the first terminal of the first inductive element and configured to be coupled to circuit ground;
   (b) an RF signal source having an output with impedance $Z_{SOURCE}$, the output being coupled between the first terminal of the first inductive element and the tunable capacitor element;
   (c) a power amplifier having an input with impedance $Z_{PA}$, the input being coupled to the first terminal of the second inductive element;
   (d) a first DC voltage source coupled to the second terminal of the first inductive element; and
   (e) a second DC voltage source coupled to the second terminal of the second inductive element;
   wherein the output of the RF signal source is inductively coupled to the input of the power amplifier and the inductive tuning circuit is configured to approximately impedance match $Z_{SOURCE}$ to $Z_{PA}$ over a selected range of RF frequencies.

3. A radio frequency (RF) amplifier circuit, including:
   (a) an inductively coupled tuning circuit including first and second stacked inductive coils having mutual inductance and each having a first terminal and a second terminal, and a digitally tunable capacitor element coupled to the first terminal of the first inductive element and configured to be coupled to circuit ground;
   (b) a driver circuit having an output with impedance $Z_{SOURCE}$, the output being coupled between the first terminal of the first inductive element and the tunable capacitor element;
   (c) a power amplifier having an input with impedance $Z_{PA}$, the input being coupled to the first terminal of the second inductive element;
   (d) a first DC voltage source coupled to the second terminal of the first inductive element; and
   (e) a second DC voltage source coupled to the second terminal of the second inductive element;
   wherein the output of the driver circuit is inductively coupled to the input of the power amplifier and the inductively coupled tuning circuit is configured to approximately impedance match $Z_{SOURCE}$ to $Z_{PA}$ over a selected range of RF frequencies.

4. The invention of claim 1 or 2, wherein the first and second inductive elements are fabricated on an integrated circuit as stacked inductive coils.

5. The invention of claim 1 or 2, wherein the RF signal source is a driver circuit.

6. The invention of claim 1 or 2, wherein the tunable capacitor element is a digitally tunable capacitor.

7. The invention of claim 1, 2, or 3, further including a first bypass capacitor coupled to the second terminal of the first inductive element.

8. The invention of claim 1, 2, or 3, further including a second bypass capacitor coupled to the second terminal of the second inductive element.

9. The invention of claim 1, 2, or 3, wherein the RF amplifier circuit is fabricated as an integrated circuit.

10. The invention of claim 9, wherein the integrated circuit is fabricated on a high Q substrate.

11. The invention of claim 9, wherein the integrated circuit is fabricated on a silicon-insulator (SOI) substrate using complementary metal oxide semiconductor (CMOS) technology.

12. A method of impedance matching a radio frequency (RF) source signal having an output with impedance $Z_{SOURCE}$ to a power amplifier input having an input with impedance $Z_{PA}$, including:

(a) inductively coupling the output of the RF source signal to the input of the power amplifier through an inductive tuning circuit including first and second inductive elements having a mutual inductance, and a tunable capacitor element coupled to the first inductive element and configured to be coupled to circuit ground;

(b) providing a first DC voltage to the output of the RF source signal through the first inductive element;

(c) providing a second DC voltage to the input of the power amplifier through the second inductive element; and (d) tuning the inductive tuning circuit to approximately impedance match $Z_{SOURCE}$ to $Z_{PA}$ over a selected range of RF frequencies.

13. A method of impedance matching a radio frequency (RF) source signal to a power amplifier input in an amplifier circuit, including:

(a) providing a power amplifier having an input with impedance $Z_{PA}$;

(b) providing an inductively coupled tuning circuit including first and second inductive elements having a mutual inductance and each having a first terminal and a second terminal, and a tunable capacitor element coupled to the first terminal of the first inductive element and configured to be coupled to circuit ground, wherein:

(1) a node between the first terminal of the first inductive element and the tunable capacitor element is configured to be coupled to an RF signal source having an output with impedance $Z_{SOURCE}$;

(2) the second terminal of the first inductive element is configured to be coupled to a first DC voltage source;

(3) the first terminal of the second inductive element is coupled to the input of the power amplifier; and (4) the second terminal of the second inductive element is configured to be coupled to a second DC voltage source;

(c) inductively coupling the output of the RF signal source to the input of the power amplifier; and (d) tuning the inductive tuning circuit to approximately impedance match $Z_{SOURCE}$ to $Z_{PA}$ over a selected range of RF frequencies.

14. A method of impedance matching a radio frequency (RF) source signal to a power amplifier input in an amplifier circuit, including:

(a) providing an inductive tuning circuit including first and second inductive elements having a mutual inductance and each having a first terminal and a second terminal, and a tunable capacitor element coupled to the first terminal of the first inductive element and configured to be coupled to circuit ground;

(b) providing an RF signal source having an output with impedance $Z_{SOURCE}$, the output being coupled between the first terminal of the first inductive element and the tunable capacitor element;

(c) providing a power amplifier having an input with impedance $Z_{PA}$, the input being coupled to the first terminal of the second inductive element;

(d) providing a first DC voltage source coupled to the second terminal of the first inductive element;

(e) providing a second DC voltage source coupled to the second terminal of the second inductive element;

(f) inductively coupling the output of the RF signal source to the input of the power amplifier; and (g) tuning the inductive tuning circuit to approximately impedance match $Z_{SOURCE}$ to $Z_{PA}$ over a selected range of RF frequencies.

15. A method of impedance matching a radio frequency (RF) source signal to a power amplifier input in an amplifier circuit, including:

(a) providing an inductively coupled tuning circuit including first and second inductive stacked inductive coils having a mutual inductance and each having a first terminal and a second terminal, and a digitally tunable capacitor element coupled to the first terminal of the first inductive element and configured to be coupled to circuit ground;

(b) providing a driver circuit having an output with impedance $Z_{SOURCE}$, the output being coupled between the first terminal of the first inductive element and the tunable capacitor element;

(c) providing a power amplifier having an input with impedance $Z_{PA}$, the input being coupled to the first terminal of the second inductive element;

(d) providing a first DC voltage source coupled to the second terminal of the first inductive element;

(e) providing a second DC voltage source coupled to the second terminal of the second inductive element;

(f) inductively coupling the output of the driver circuit to the input of the power amplifier; and (g) tuning the inductive tuning circuit to approximately impedance match $Z_{SOURCE}$ to $Z_{PA}$ over a selected range of RF frequencies.

16. The method of claim 13 or 14, further including fabricating the first and second inductive elements on an integrated circuit as stacked inductive coils.

17. The method of claim 13 or 14, wherein the RF signal source is a driver circuit.

18. The method of claim 13 or 14, wherein the tunable capacitor element is a digitally tunable capacitor.

19. The method of claim 13, 14, or 15, further including providing a first bypass capacitor coupled to the second terminal of the first inductively coupled element.

20. The method of claim 13, 14, or 15, further including providing a second bypass capacitor coupled to the second terminal of the second inductive element.

21. The method of claim 13, 14, or 15, further including fabricating the RF amplifier circuit as an integrated circuit.

22. The method of claim 21, further including fabricating the integrated circuit on a high Q substrate.

23. The method of claim 21, further including fabricating the integrated circuit on a silicon-on-insulator (SOI) substrate using complementary metal oxide semiconductor (CMOS) technology.

* * * * *